(12) United States Patent
Furman et al.

(10) Patent No.: US 8,050,359 B2
(45) Date of Patent: Nov. 1, 2011

(54) CONTINUOUSLY VARIABLE PHASE FREQUENCY SHIFT KEYING

(75) Inventors: William N. Furman, Fairport, NY (US); John W. Nieto, Rochester, NY (US)

(73) Assignee: Harris Corporation, Melbourne, FL (US)

(*) Notice: Subject to any disclaimer, the term of this patent is extended or adjusted under 35 U.S.C. 154(b) by 877 days.

(21) Appl. No.: 11/734,415

(22) Filed: Apr. 12, 2007

(65) Prior Publication Data

US 2008/0253480 A1  Oct. 16, 2008

(51) Int. Cl.
*H03K 7/06* (2006.01)
(52) U.S. Cl. ............................................. 375/303
(58) Field of Classification Search .............. 375/259, 375/269, 268, 272, 271, 302, 303, 309; 332/100
See application file for complete search history.

(56) References Cited

U.S. PATENT DOCUMENTS

| | | | |
|---|---|---|---|
| 3,890,581 A * | 6/1975 | Stuart et al. | 332/101 |
| 3,938,045 A * | 2/1976 | Mathwich | 375/305 |
| 3,997,855 A * | 12/1976 | Nash | 332/101 |
| 5,857,003 A * | 1/1999 | Geiger et al. | 375/319 |

* cited by examiner

*Primary Examiner* — David C. Payne
*Assistant Examiner* — Vineeta Panwalkar
(74) *Attorney, Agent, or Firm* — Fox Rothschild, LLP; Robert J. Sacco

(57) ABSTRACT

Method for modulating an RF signal includes the steps of modulating an RF signal using frequency shift keying (FSK) modulation to define a plurality of symbols ($203_0$, $203_1$). The FSK modulation includes transitioning the modulated signal (204) between at least two different frequencies ($f_1$ and $f_0$) during a guard period (210). The method includes the further step of varying a frequency of the modulated signal 204 during the guard period (210) in accordance with a predetermined rate of change. The predetermined rate of change is selected to minimize a bandwidth of the RF signal.

21 Claims, 5 Drawing Sheets

CONTINUOUSLY VARIABLE PHASE FREQUENCY SHIFT KEYING

BACKGROUND OF THE INVENTION

1. Statement of the Technical Field

The inventive arrangements relate to radio frequency modulation techniques, and more particularly to an improvement in frequency shift keying (FSK).

2. Description of the Related Art

Frequency-shift keying (FSK) is a conventional method for modulating an RF signal, FSK is a special type of frequency modulation which uses a baseband modulation signal to selectively vary a transmitted signal between two or more predetermined instantaneous frequency values. One common arrangement uses just two predetermined instantaneous frequencies. In such systems, it is common to refer to one frequency as the mark frequency and to a second frequency as the space frequency.

In some conventional types of FSK, there can be a phase discontinuity that occurs when the FSK modulated RF signal transitions from a sinusoidal waveform with one frequency value to a sinusoidal waveform with a second frequency value. Such a phase discontinuity can have several negative aspects. For example, such phase discontinuities can cause amplifier distortion and can result in the presence of wideband components in the modulated RF signal. In order to avoid such problems, it is known in the art that phase discontinuity in an FSK signal can be eliminated by using a technique known as continuous-phase frequency-shift keying (CPFSK). As the name implies, an RF signal that is modulated using CPFSK excludes any abrupt change in the phase angle.

Notwithstanding the continuous phase aspect of CPFSK signals, the frequency of the modulated signal can vary instantaneously when the modulated RF signal transitions from a sinusoidal waveform with one frequency value to a sinusoidal waveform with a second frequency value. Such an instantaneous frequency discontinuity can have several negative aspects. For example, such frequency discontinuities can increase the bandwidth of the transmitted signal, but not to the extent that the phase discontinuities would in the case of a non CPFSK modulator.

When FSK is received in a multi-path rich environment, a guard period is usually employed where the initial N samples of the transmitted signal are discarded in the reception process. The purpose in doing so is to avoid the use of samples that may have been corrupted by multi-path transmission of the previous symbol which may have been sent at a different frequency. The actual guard period can vary in different system designs, depending on various design considerations. For example a guard period may consist of 25% of the total time during which a particular symbol is transmitted. The guard period will typically begin when the transmitted signal transitions from one frequency to a second frequency.

SUMMARY OF THE INVENTION

The invention concerns a method for modulating an RF signal. The method includes the steps of modulating an RF signal using frequency shift keying (FSK) modulation to define a plurality of symbols. For example, the FSK modulation can be a continuous phase frequency shift modulation (CPFSK). The FSK modulation includes transitioning the RF signal between at least two different frequencies beginning at a transition start time. A guard period time interval is defined during which samples of the RF signal are not used for identifying the plurality of symbols. The guard period extends a predetermined duration from the transition start time. The method includes the further step of varying a frequency of the RF signal during the guard period in accordance with a predetermined rate of change. The predetermined rate of change is selected to minimize the bandwidth of the RF signal.

According to one aspect of the invention, the method includes continuously varying the frequency of the RF signal during the guard period. For example, the frequency can be continuously monotonically varied between at least a first one of the two different frequencies to at least a second one of the two different frequencies.

The actual amount of time during the guard period during which the frequency of the RF signal is varied can be selected in accordance with a particular application. In this regard, it should be understood that longer time periods for changing the frequency are generally more advantageous for reducing a bandwidth of the RF signal. According to one aspect, a frequency of the RF signal is varied during at least about 20% of a total time interval comprising the guard period. According to another aspect, a frequency of the RF signal is varied during at least about 40% of a total time interval comprising the guard period. According to yet another aspect, a frequency of the RF signal is varied during at least about 60% of a total time interval comprising the guard period.

The predetermined rate of change can be selected in accordance with a particular design. In this regard, it should be understood that the predetermined rate of change can be linear or non-linear. Further, it should be understood that the predetermined rate of change can be time invariant or time varying.

BRIEF DESCRIPTION OF THE DRAWINGS

Embodiments will be described with reference to the following drawing figures, in which like numerals represent like items throughout the figures, and in which.

DETAILED DESCRIPTION OF THE PREFERRED EMBODIMENTS

The invention will now be described more fully hereinafter with reference to accompanying drawings, in which illustrative embodiments of the invention are shown. This invention, may however, be embodied in many different forms and should not be construed as limited to the embodiments set forth herein. For example, the present invention can be embodied as a method, a data processing system, or a computer program product. Accordingly, the present invention can take the form as an entirely hardware embodiment, an entirely software embodiment, or a hardware/software embodiment.

Figure 1:
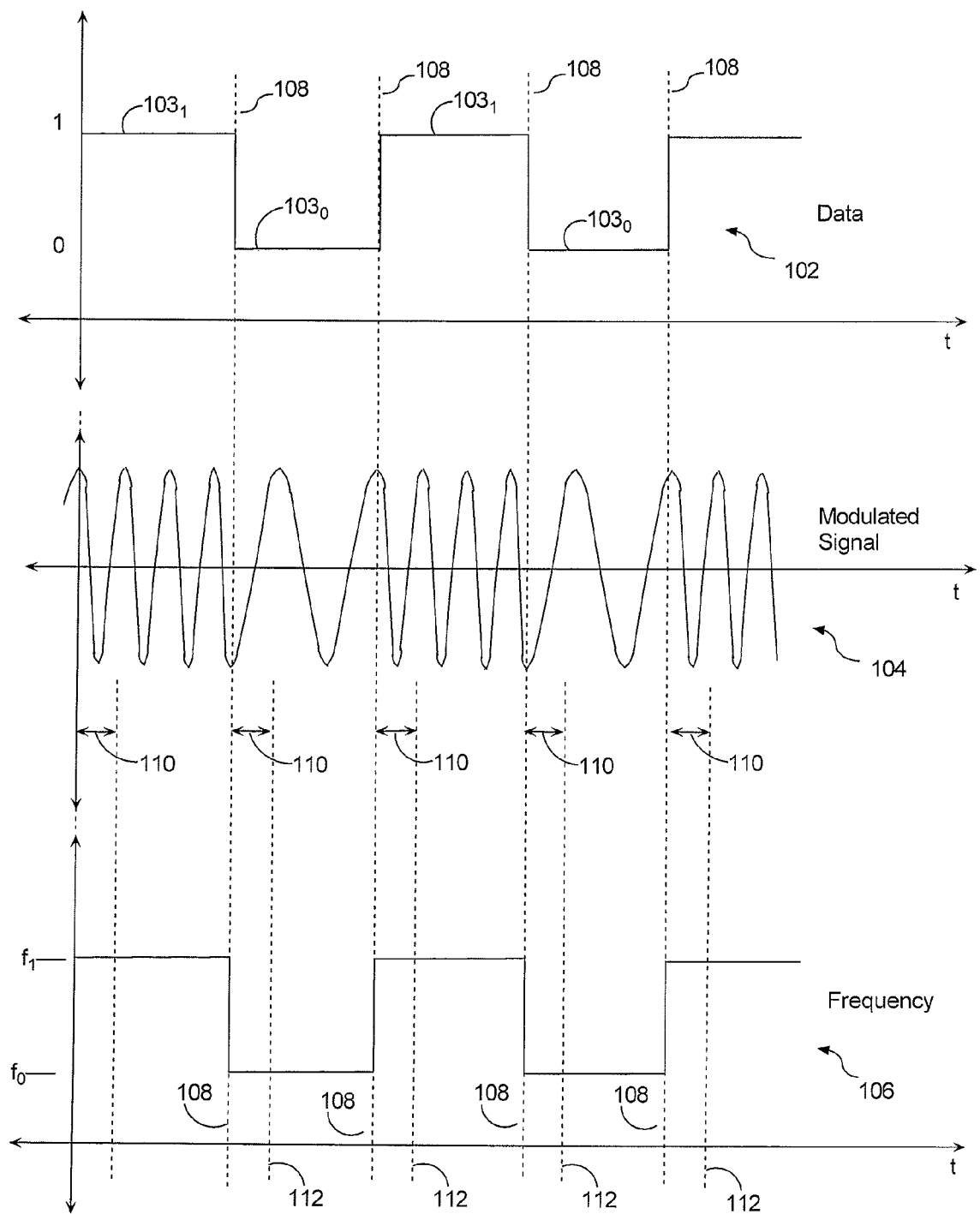
FIG. 1 is diagram showing the timing of a CPFSK signal of the prior art.

FIG. 1 is a timing diagram relating to a conventional frequency shift keying (FSK) of an RF signal. As shown in FIG. 1, a baseband data signal 102 plotted as a function of voltage (V) and time (t) comprises data which is used to control a modulation of an RF signal 104. In general, baseband data signal 102 can comprise a plurality of symbols $103_1$, $103_0$ that are useful for communicating digital data. For convenience, the baseband data signal in FIG. 1 is shown as a binary signal having two symbol states, namely 1, 0 corresponding to different voltages. Accordingly, the baseband data signal 102 comprises only two different symbols. However, any number of symbols can be transmitted using FSK. The baseband data signal 102 is used to vary a frequency of the modulated signal 104 among a plurality of predetermined frequencies. It can be observed in FIG. 1 that the modulated RF signal 104 varies between frequency $f_1$ an frequency $f_0$ at transition time 108.

The timing diagram in FIG. 1 also includes a plot 106 which shows the instantaneous frequency of the modulated signal 104 as a function of time. Plot 106 is a graphic illustration which helps to show how the frequency of the modulated RF signal 104 varies from frequency $f_1$ to frequency $f_0$ at transition time 108. Plot 106 is useful for illustrating the nearly instantaneous change from frequency $f_1$ to frequency $f_0$ at transition time 108 which is typical of FSK type modulated signals of the prior art.

Finally, it can be observed in FIG. 1, that there is a guard period 110 that begins at transition time 108 and extends a predetermined amount of time to end at time 112. When a modulated signal 104 is received in a multi-path rich environment, the initial N samples of the modulated signal 104 received by a receiver during the guard period 110 are typically discarded as part of the receiving process. The purpose in discarding these samples of the modulated signal 104 is to avoid the use of samples that may have been corrupted by multi-path transmission of the previous symbol, which may have been modulated so as to have a different frequency. The actual length of time corresponding to guard period 110 can vary in different system designs, depending on various considerations. For example a guard period 110 may consist of 25% of the total time during which a particular symbol $103_0$, $103_1$ is transmitted.

Figure 2:
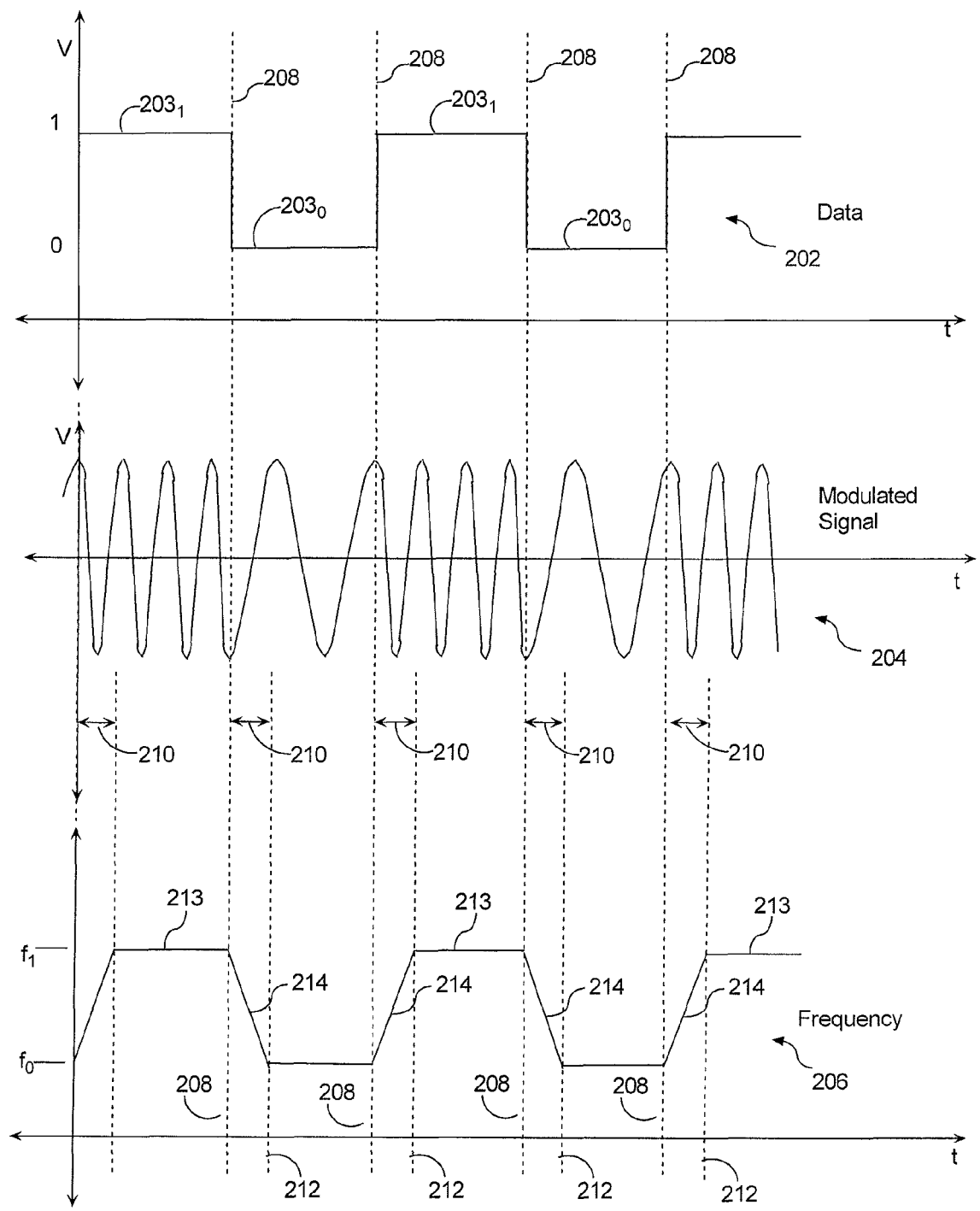
FIG. 2 is a diagram that is useful for understanding a timing of a CPFSK signal of the present invention.

Referring now to FIG. 2, there is illustrated a set of timing diagrams similar to the timing diagram shown in FIG. 1. FIG. 2 shows a baseband data signal 202 plotted as a function of voltage (V) and time (t). The baseband data signal is used to control a modulation of van RF signal 204. In general, baseband data signal 202 comprises a plurality of symbols $203_1$, $203_0$ that are useful for communicating digital data. For convenience, the baseband data signal in FIG. 2 is shown as a binary signal having two symbol states, namely 1, 0 corresponding to different voltages. Accordingly, the baseband data signal 202 comprises only two different symbols. However, it should be understood that the invention is not limited in this regard. The baseband data signal 202 is used to vary a frequency of the modulated signal 204 among a plurality of predetermined frequencies. A wide variety of FSK modulator circuits are known in the art for implementing such modulation responsive to a baseband data signal. Accordingly, FSK modulator circuits will not be described here in detail.

Since the baseband data signal 202 in the embodiment shown is only comprised of two symbol states 1, 0, the modulated RF signal 204 is only varied between two frequencies, namely $f_1$ and $f_0$. However, it will be readily understood by those skilled in the art that the modulated RF signal 204 can be varied between more than two such frequencies. The number of different frequencies can correspond to the number of different symbols used to comprise the baseband data signal 202. It can also be observed that the baseband signal 202 repeatedly varies from one symbol state to another symbol state at a transition time 208.

In FIG. 2, the frequencies $f_1$ and $f_0$ are each shown as a series of one or more cycles comprising sinusoidal waveforms. In this regard, it will be appreciated that only a few cycles are shown for each frequency for greater clarify and understanding. In reality, however, each symbol comprising the modulated RF signal 204 could be comprised of many more cycles of frequency $f_1$ and $f_0$. For example, each symbol could comprise hundreds or thousands of cycles at each such frequency. Further, it should be appreciated that the invention is not limited to sinusoidal waveforms as shown. Instead, other types of waveforms can also be used. It can be observed in FIG. 2 that the modulated RF signal 204 varies from frequency $f_1$ to frequency $f_0$ at transition time 208.

The timing diagram in FIG. 2 also includes a plot 206 which shows the instantaneous frequency of the modulated signal 204 as a function of time. Plot 206 is a graphic illustration which helps to show how the frequency of the modulated RF signal 204 varies from frequency $f_1$ to frequency $f_0$ at transition time 208. Plot 206 is significant in this regard as it is useful for illustrating the selectively controlled variation of modulated signal 204 from frequency $f_1$ to frequency $f_0$ at transition time 208. In this regard, the present invention represents a significant departure from FSK modulation techniques of the prior art. Unlike the abrupt and nearly instantaneous frequency transition that occurs at transition time 108 in FIG. 1, the frequency transitions in FIG. 2 occurs in a controlled manner during the guard period 210. This is illustrated in FIG. 2 by means of a sloped line segment 214 in the frequency plot 206.

In FIG. 2, it can be observed that the guard period 210 begins at transition time 208 and extends a predetermined amount of time to end at time 212. It is known in the art that when an FSK modulated signal 204 is received in a multi-path rich environment, the initial N samples of the modulated signal 204 received by a receiver during the guard period 210 are discarded as part of the receiving process. Accordingly, the frequency of the modulated signal 204 during this time period is not critical. All that is necessary is that the modulated signal has the correct frequency at the time 212 when the guard period 210 terminates.

It will be appreciated that the conventional purpose of the guard period 210 is to avoid the use of samples that may have been corrupted by multi-path transmission of the previous symbol which has been transmitted. In contrast, the present invention takes advantage of this guard period to selectively control the transition of the modulated signal 204 from frequency $f_0$ to $f_1$ over an extended period of time so as to reduce the overall bandwidth of the modulated signal 204.

According to one embodiment of the invention shown in FIG. 2, the method of FSK modulation disclosed herein includes continuously varying the frequency of the modulated signal 104 in a controlled way during at least a portion of the guard period 210. For example, the frequency can be continuously monotonically varied at some predetermined rate of change, and in a controlled manner, between $f_1$ and $f_0$ during all or part of the guard period. The predetermined rate of change can be selected in accordance with a particular design. In this regard, it should be understood that the predetermined rate of change can be time invariant or time varying. Thus, the line segment 214 can be linear or non-linear.

The actual amount of time during the guard period 210 during which the frequency of the modulated signal is varied can be selected in accordance with a particular modulation application. In this regard, it should be understood that longer time periods for changing the frequency are generally more advantageous for reducing a bandwidth of a modulated signal 204. In FIG. 2, it can be observed that the frequency of the modulated signal is varied during the entire time interval comprising the guard period 210. However, it should be understood that the invention is not limited in this regard. According to one embodiment of the invention, a frequency of the modulated signal 204 is varied during at least about 20% of a total time interval comprising the guard period 210. According to another embodiment, a frequency of the modulated signal 204 is varied during at least about 40% of a total time interval comprising the guard period 210. According to yet another aspect, a frequency of the modulated signal is varied during at least about 60% of a total time interval comprising the guard period 210.

According to one embodiment of the invention, the FSK modulation used to form the modulated signal 204 can be a continuous phase frequency shift modulation (CPFSK). Techniques for performing CPFSK modulation are well known in the art and therefore will not be described here in detail. Combining conventional CPFSK with the method described of selectively controlling the change in frequency during the guard period shall be referred to herein as continuously variable phase frequency shift keying (CVPFSK).

In a preferred embodiment of the invention, the portion of the guard period during which the frequency is varied, and the predetermined rate of change at which frequency is varied during such time period, is selected to minimize a bandwidth of the RF signal. In FIG. 2, line segment 214 is linear, indicating that the frequency changes at a constant rate during the time period. However, it is important to understand that the invention is not limited in this regard. Instead, the line segment 214, which defines the frequency variation during the guard period, can be advantageously selected to include a non-linear curve for providing a reduced bandwidth of the RF signal. In this regard, it should be understood that the line segment 213 in FIG. 2 can also be selected to be somewhat non-linear. Line segment 213 can be modified to achieve a reduced bandwidth of the RF signal.

Figure 3:
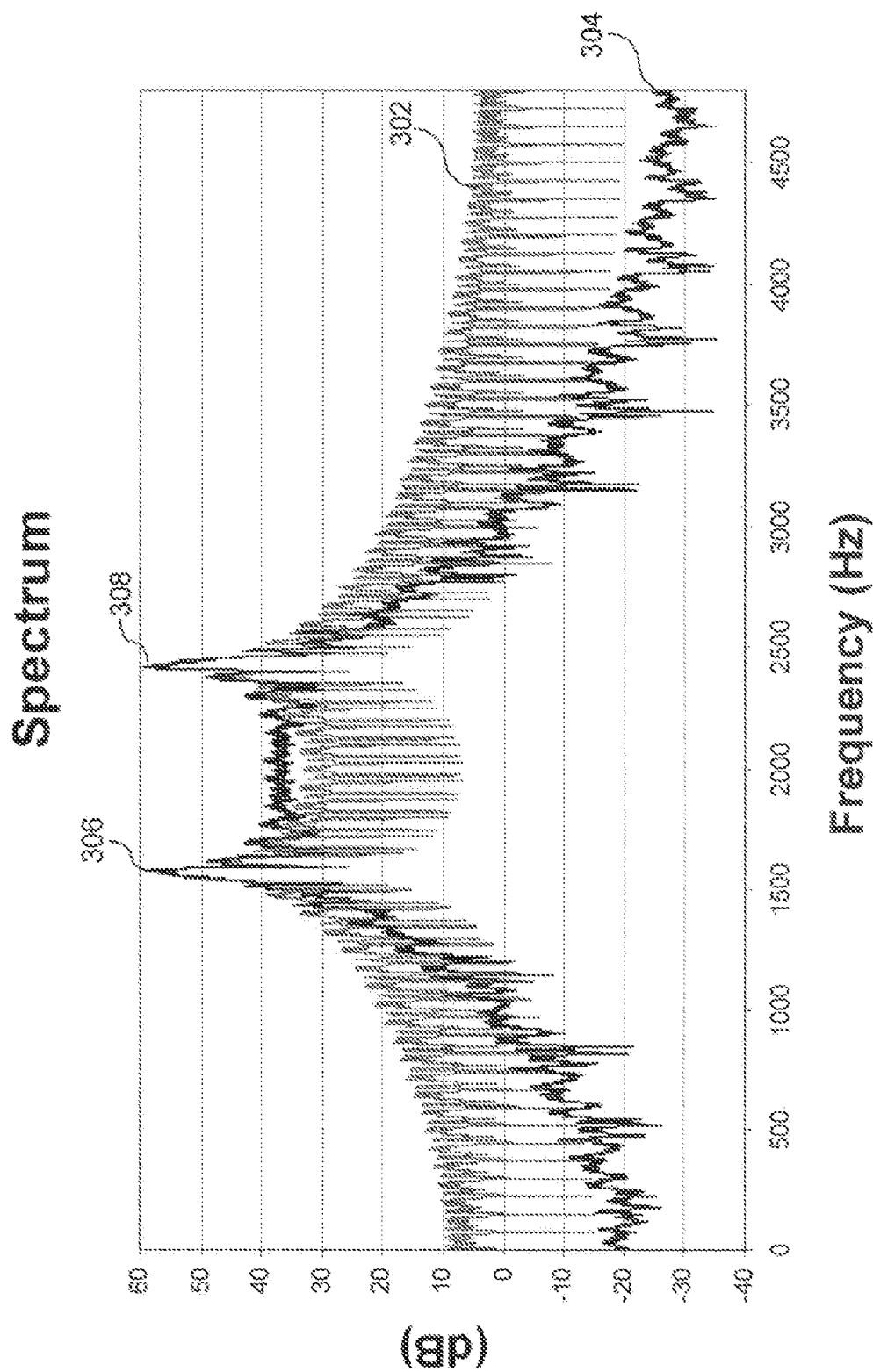
FIG. 3 is plot that is useful for understanding how the frequency spectrum of a CPFSK signal of the prior art can be improved with the present invention.

FIG. 3 is a computer simulation showing the spectral energy in dB over a range of frequencies for two different modulated signals. A plot 302 shows the spectral energy associated with a standard CPFSK signal. A plot 304 shows the spectral energy of a modulated signal utilizing the CVPFSK method of modulation disclosed herein. The plot 304 was determined based on simulated signal in which a defined guard time consisted of 25% of the total time a symbol was transmitted. The simulation also assumes a linear frequency variation occurring during this entire guard time. The plot 304 shows a spectral improvement for the CVPFSK signal as compared to the conventional CPFSK modulated signal. It can be observed in FIG. 3 that the spectral energy in the CVPFSK modulated signal represented by plot 304 has slightly higher spectral energy between the energy peaks 306, 308 as compared to the conventional CPFSK modulated signal represented by the plot 302. The energy peaks 306, 308 correspond to the FSK signaling tones of 1500 Hz and 2500 Hz. However, it can be observed that the CVPFSK energy advantageously rolls off more rapidly above and below the FSK signaling tones.

More significantly, the 99% and 99.9% power bandwidths of the standard CPFSK signal represented by plot 302 are 1061 Hz and 1784 Hz, respectively. By comparison, the 99% and the 99.9% power bandwidth of the CVPFSK signal represented by plot 304 are 974 Hz and 1149 Hz, Thus, both the 99% and the 99.9% power bandwidth of the CVPFSK signal are smaller as compared to 99% and 99.9% power bandwidths of the standard CPFSK signal. Significantly, computer simulations predict that there will be no degradation in the bit error rate (BER) resulting from the improved modulation scheme disclosed herein. These improvements in spectral power bandwidth are advantageous for reducing adjacent channel interference. They also offer the potential for reducing the peak-to-average ratio of signals after analog filtering since the CVPFSK modulated signal has improved spectral properties as compared to conventional CPFSK modulated signals. Yet another advantage of the present invention is that it offers backward compatibility with legacy demodulators with no degradation in performance.

Figure 4:
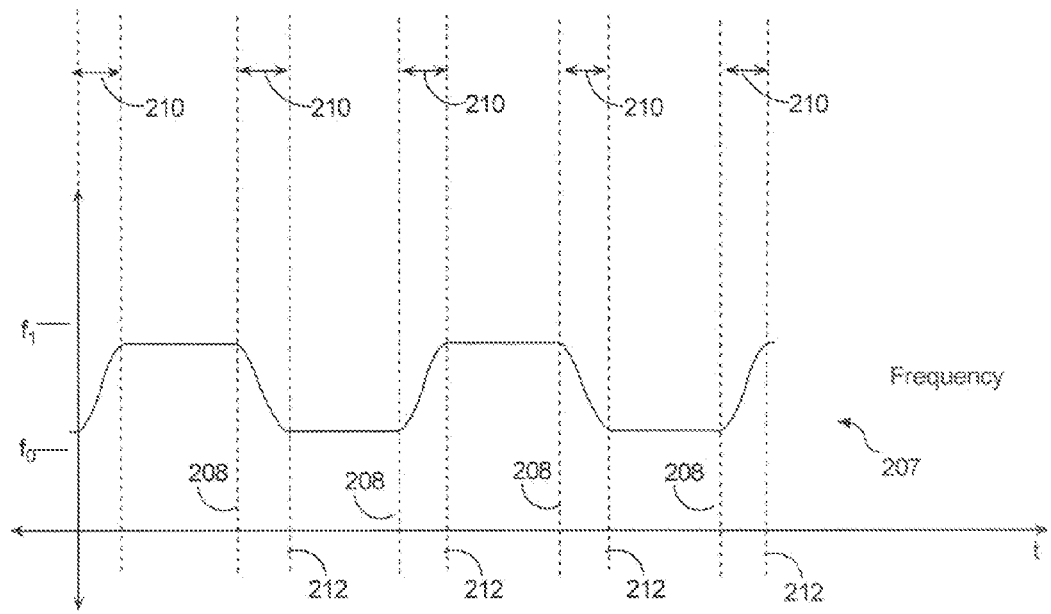
FIG. 4 is a plot that is useful for understanding an alternative embodiment of the invention.

According to an embodiment of the invention shown in FIG. 4, a frequency variation defined by plot 207 can be used in place of the plot 206. As shown in FIG. 4, the plot 207 defines a change in frequency over time which is non-linear so as to execute the frequency variation without any sharp discontinuities in frequency during the guard period. For example, the variation in frequency during the guard period can be defined by a raised cosine curve similar to that shown in FIG. 4. Still, the invention is not limited in this regard and any other curve can also be used during the guard period to the extent that it helps minimize sharp discontinuities in frequency occurring during the guard period. Significantly, it has been determined that varying a frequency in accordance with a raised cosine curve shown in plot 207 and the linear technique illustrated in plot 206 will result in almost the same 99% and 99.9% power bandwidths in each case. However, in the case of the raised cosine curve, the RF energy outside the 99% and 99.9% bandwidth is considerably lower as compared to the linear technique shown in 206. Accordingly, the raised-cosine approach shown in FIG. 4 is presently preferred.

Figure 5:
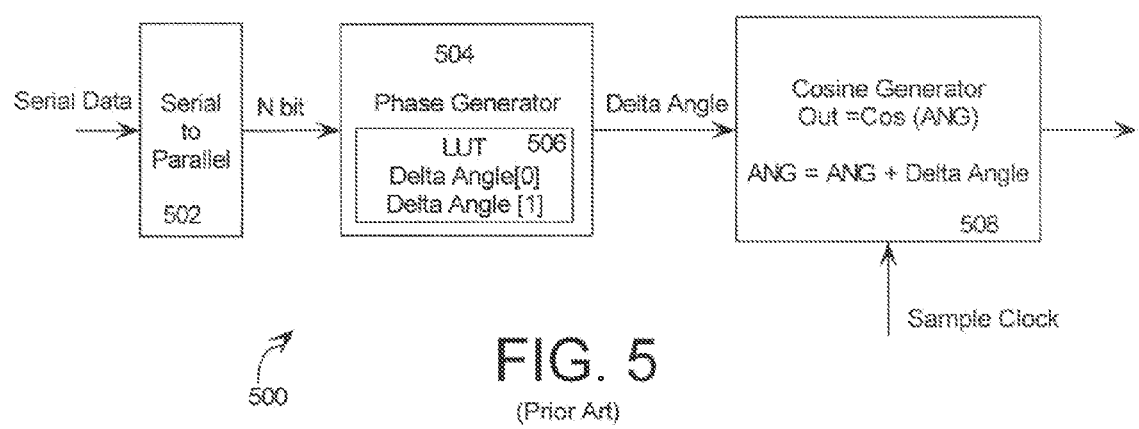
FIG. 5 is a block diagram of a conventional CPFSK modulator.

Any suitable FSK modulator can be used for implementing the CVPFSK modulation scheme disclosed herein. FIG. 5 is a block diagram which shows a standard CPFSK modulator 500. In FIG. 5, a serial bit stream of data is the input. The serial to parallel block 502 forms N bit symbols. In the case of binary CPFSK the symbols are 1 bit. The N bit symbol drives the phase generator 504 which uses the bits to access delta phase angle data in a look-up-table (LUT) 506.

In a conventional phase generator 504, there is a delta phase angle $\phi_f$ which is stored in the LUT 506 for each frequency of a sinusoidal waveform which is to be generated. The frequency of the sinusoidal waveform is generated by integrating the delta angle. For example, a sequence of waveform samples would be $\cos(0)$, $\cos(\phi_f)$, $\cos(2\phi_f)$, $\cos(3\phi_f)$ and so on. Each new sample is generated by adding delta to the previous phase angle and then calculating the cosine function based on that value. This technique is well known in the art. If it is desired to change the frequency, a different value of delta phase angle is selected from the LUT. The phase generator 504 determines the delta phase angle of the frequency that needs to be generated based on the N bit symbol which is input into the phase generator. Notably, a change in the delta phase angle will not produce a discontinuity in phase, but will produce an instantaneous change in frequency.

Note that the CPFSK waveform is usually generated at multiple (e.g., 4, 8, 16 . . . ) samples per symbol. It is for this reason that a separate sample clock input is conventionally used to drive the cosine generator 508. The cosine generator 508 generates the required FSK tone based on the delta phase angle from the phase generator 504. As long as the value of the variable ANG in the cosine generator remains continuous and naturally rolls over from $2\pi$ to 0 the generated FSK will have a continuous phase.

Figure 6:
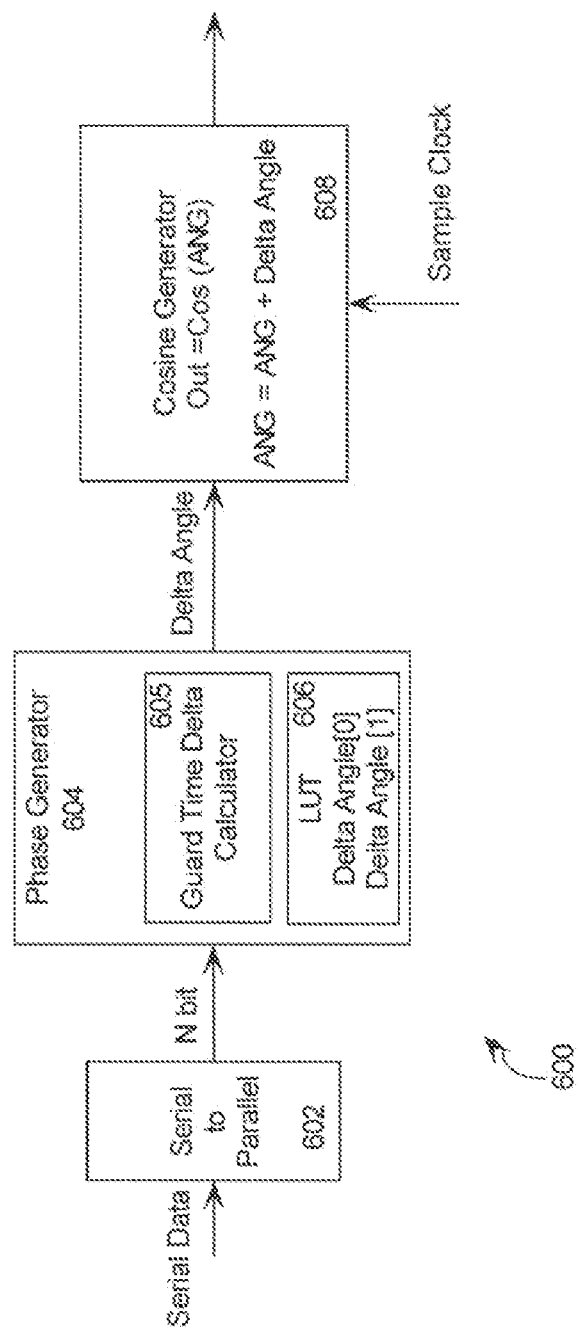
FIG. 6 is a block diagram that is useful for understanding a CPFSK modulator in accordance with the inventive arrangements.

Referring now to FIG. 6, there is illustrated an FSK modulator 600 which can be used for implementing the invention. The FSK modulator 600 is similar to the FSK modulator 500. For example FSK modulator 600 has a serial to parallel block 602, a phase generator 604, a LUT 606, and a cosine generator 608. Significantly, however the FSK modulator has some added functionality in the phase generator 604. In particular, the phase generator 604 at a data transition must modify the delta phase output to the cosine generator. In phase generator 604, the value of the delta phase angle is modified in order to achieve a selected profile of the frequency transition. For example, the delta phase angle can change for every sample of the guard period 210 to produce a continuous variation in frequency during the period. According to an embodiment of the invention, the delta phase angle for each sample can be varied in a linear or non-linear manner to produce a desired frequency transition, such as the frequency transition shown in plot 206 or 207 in FIG. 2 and FIG. 4). In this regard, it will be appreciated that the delta phase angle is modified such that the last sample of the guard time places the delta phase at the final delta phase needed for producing the desired frequency of the next symbol.

The invention described and claimed herein is not to be limited in scope by the preferred embodiments herein disclosed, since these embodiments are intended as illustrations of several aspects of the invention. Any equivalent embodiments are intended to be within the scope of this invention. Indeed, various modifications of the invention in addition to those shown and described herein will become apparent to those skilled in the art from the foregoing description. Such modifications are also intended to fall within the scope of the appended claims.

It should also be recognized that the present invention can be realized in hardware, software, or a combination of hardware and software. Any kind of computer system, or other apparatus adapted for carrying out the methods described herein, is suited. A typical combination of hardware and software could be a general purpose computer processor or digital signal processor with a computer program that when being loaded and executed, controls the computer system such that it carries out the methods described herein.

The present invention can also be embedded in a computer program product, which comprises all the features enabling the implementation of the methods described herein, and which, when loaded in a computer system, is able to carry out these methods. Computer program or application in the present context means any expression, in any language, code or notation, of a set of instructions intended to cause a system having an information processing capability to perform a particular function either directly or after either or both of the following a) conversion to another language, code or notation; b) reproduction in a different material form. Additionally, the description above is intended by way of example only and is not intended to limit the present invention in any way, except as set forth in the following claims.

We claim:

1. A method for modulating an RF signal, comprising
modulating an RF signal using frequency shift keying (FSK) modulation to define a plurality of symbols, said FSK modulation including transitioning an FSK tone between at least two different frequencies beginning at a transition start time;
defining a guard period time interval during which samples of the FSK tone are not used for identifying said plurality of symbols, said guard period extending a predetermined duration from said transition start time;
generating said FSK tone by using a sinusoidal waveform generator which determines a sinusoidal output sample value based on an input phase angle, and generates each said sample value by adding a delta phase angle to a previous said input phase angle; and
performing operations in a phase domain to vary a frequency of said FSK tone in accordance with a predetermined rate of change, said operations including selectively varying said delta phase angle during said guard period to change said frequency of said FSK tone in accordance with a selected frequency transition profile.

2. The method according to claim 1, wherein said predetermined rate of change is selected to minimize a bandwidth of said RF signal.

3. The method according to claim 1, wherein said frequency of said FSK tone is continuously monotonically varied between at least a first one of said two different frequencies to at least a second one of said two different frequencies.

4. The method according to claim 1, wherein said performing step further comprises varying said frequency of said FSK tone during at least about 20% of a total time interval comprising said guard period.

5. The method according to claim 1, wherein said performing step further comprises varying said frequency of said FSK tone during at least about 40% of a total time interval comprising said guard period.

6. The method according to claim 1, wherein said performing step further comprises varying said frequency of said FSK tone during at least about 60% of a total time interval comprising said guard period.

7. The method according to claim 1, wherein said predetermined rate of change is linear.

8. The method according to claim 1, wherein said predetermined rate of change is non-linear.

9. The method according to claim 1, further comprising selecting said FSK modulation to be a continuous phase frequency shift modulation (CPFSK).

10. The method according to claim 1, wherein said frequency is continuously varied in accordance with a pattern defined by a raised cosine curve.

11. A method for modulating an RF signal, comprising
modulating an RF signal using frequency shift keying (FSK) modulation to define a plurality of symbols, said FSK modulation including transitioning an FSK tone between at least two different frequencies beginning at a transition start time;
defining a guard period time interval during which samples of the FSK tone are not used for identifying said plurality of symbols, said guard period extending a predetermined duration from said transition start time;
generating said FSK tone by using a sinusoidal waveform generator which determines a sinusoidal output sample value based on an input phase angle, and generates each said sample value by adding a delta phase angle to a previous said input phase angle; and
performing operations in a phase domain to vary a frequency of said FSK tone, said operations including selectively varying said delta phase angle during said guard period to change said frequency of said FSK tone in accordance with a predetermined profile selected to minimize an RF bandwidth of said RF signal.

12. The method according to claim 11, wherein said frequency is continuously varied in accordance with a pattern defined by a raised cosine curve.

13. A method for modulating an RF signal, comprising
modulating an RF signal using frequency shift keying (FSK) modulation to define a plurality of symbols, said FSK modulation including transitioning an FSK tone between at least two different frequencies beginning at a transition start time;

defining a guard period time interval during which samples of the FSK tone are not used for identifying said plurality of symbols, said guard period extending a predetermined duration from said transition start time;

generating said FSK tone by using a sinusoidal waveform generator which determines a sinusoidal output sample value based on an input phase angle, and generates each said sample value by adding a delta phase angle to a previous said input phase angle;

performing operations in a phase domain to vary a frequency of said FSK tone, said operations including selectively varying said delta phase angle during said guard period to change said frequency of said FSK tone in accordance with a predetermined profile that is exclusive of frequency discontinuities;

wherein said operations exclusively vary a frequency of said FSK tone during at least about 20% of a total time interval comprising said guard period in accordance with a predetermined rate of change selected to minimize an RF bandwidth of said RF signal.

14. The method according to claim 13, wherein said predetermined rate of change is selected to minimize a bandwidth of said RF signal.

15. The method according to claim 13, wherein said FSK tone frequency is continuously monotonically varied between at least a first one of said at least two different frequencies to at least a second one of said two different frequencies.

16. The method according to claim 13, wherein said predetermined rate of change is linear.

17. The method according to claim 13, wherein said predetermined rate of change is non-linear.

18. The method according to claim 13, further comprising selecting said FSK modulation to be a continuous phase frequency shift modulation (CPFSK).

19. The method according to claim 13, further comprising selecting said predetermined rate of change to concentrate spectral energy between at least a first one of said two different frequencies and a second one of said two different frequencies.

20. The method according to claim 13, wherein said frequency is continuously varied in accordance with a pattern defined by a raised cosine curve.

21. The method according to claim 1, wherein said delta phase angle is changed for each sample during said guard period.

* * * * *